United States Patent
Ishikawa et al.

[11] Patent Number: 5,302,538
[45] Date of Patent: Apr. 12, 1994

[54] METHOD OF MANUFACTURING FIELD EFFECT TRANSISTOR

[75] Inventors: Eiichi Ishikawa; Takayuki Saito; Shinya Watanabe, all of Hyogo, Japan

[73] Assignee: Mitsubishi Denki Kabushiki Kaisha, Tokyo, Japan

[21] Appl. No.: 65,327

[22] Filed: May 21, 1993

[30] Foreign Application Priority Data

Aug. 4, 1992 [JP] Japan ................................ 4-207798

[51] Int. Cl.⁵ .................................................. H01L 21/336
[52] U.S. Cl. ................................................ 437/40; 437/41; 437/192; 437/193; 437/200; 437/229; 156/653; 156/656; 156/657; 156/659.1
[58] Field of Search ............... 437/40, 41, 192, 193, 437/200, 228, 229, 948, 962; 148/DIG. 104, DIG. 105, DIG. 106; 156/653, 656, 657, 659.1, 660

[56] References Cited

U.S. PATENT DOCUMENTS

| | | | |
|---|---|---|---|
| 4,838,994 | 6/1989 | Gulde et al. | 156/643 |
| 4,892,613 | 1/1990 | Motai et al. | 156/643 |
| 5,045,150 | 9/1991 | Cleeves et al. | 156/643 |
| 5,066,615 | 11/1991 | Brady et al. | 437/229 |
| 5,106,786 | 4/1992 | Brady et al. | 437/229 |
| 5,118,384 | 6/1992 | Harmon et al. | 156/643 |

FOREIGN PATENT DOCUMENTS

| | | |
|---|---|---|
| 63-292649 | 11/1988 | Japan . |
| 1-241162 | 9/1989 | Japan . |
| 2-58212 | 2/1990 | Japan . |
| 2-79463 | 3/1990 | Japan . |
| 2-250321 | 10/1990 | Japan . |
| 3-133129 | 6/1991 | Japan . |
| 4-96220 | 3/1992 | Japan . |
| 4-206817 | 7/1992 | Japan . |
| 4-209565 | 7/1992 | Japan . |

Primary Examiner—T. N. Quach
Attorney, Agent, or Firm—Lowe, Price, LeBlanc & Becker

[57] ABSTRACT

When exposure light reaches a silicon oxide film, this light is multiply reflected in the silicon oxide film to spread or narrow a photoresist layer. A tungsten silicide film prevents the exposure light from reaching the silicon oxide film. This silicon oxide film is employed as a mask to selectively remove a polycrystalline silicon film and a tungsten silicide film by etching for forming a gate electrode, while the tungsten silicide film is simultaneously removed by this etching.

10 Claims, 14 Drawing Sheets

METHOD OF MANUFACTURING FIELD EFFECT TRANSISTOR

BACKGROUND OF THE INVENTION

1. Field of the Invention

The present invention relates to a method of manufacturing a field effect transistor, and more particularly, it relates to a method of manufacturing a field effect transistor which can improve dimensional accuracy of a gate electrode.

2. Description of the Background Art

Figure 25:
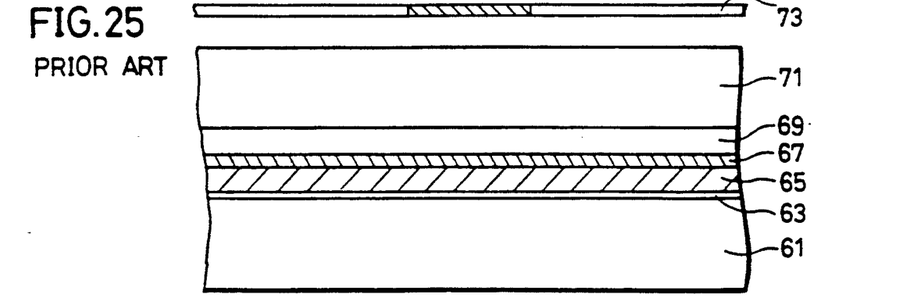
FIGS. 25 to 32 are sectional views of a silicon substrate showing first to eighth steps in a conventional method of manufacturing a field effect transistor.

A conventional method of manufacturing a MOS (metal oxide semiconductor) field effect transistor is now described. As shown in FIG. 25, a silicon oxide film 63, a polycrystalline silicon film 65, a tungsten silicide film 67, another silicon oxide film 69 and a photoresist layer 71 are successively formed on a silicon substrate 61. Then, a mask 73 is arranged above the photoresist layer 71 for forming a gate electrode.

Figure 26:
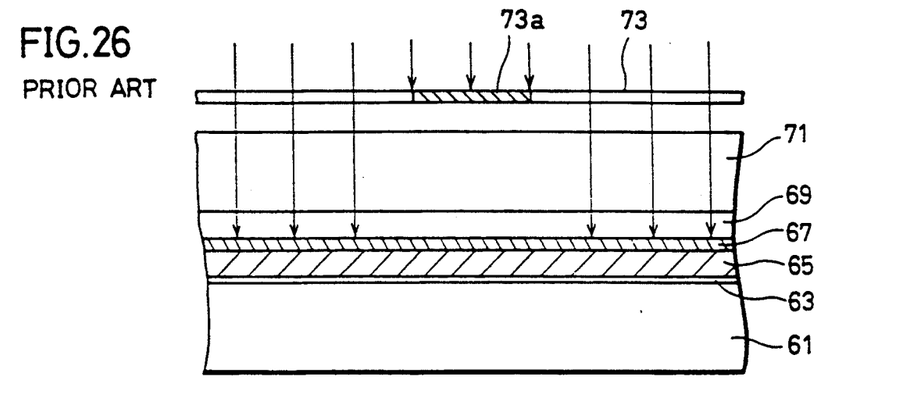
Figure 27:
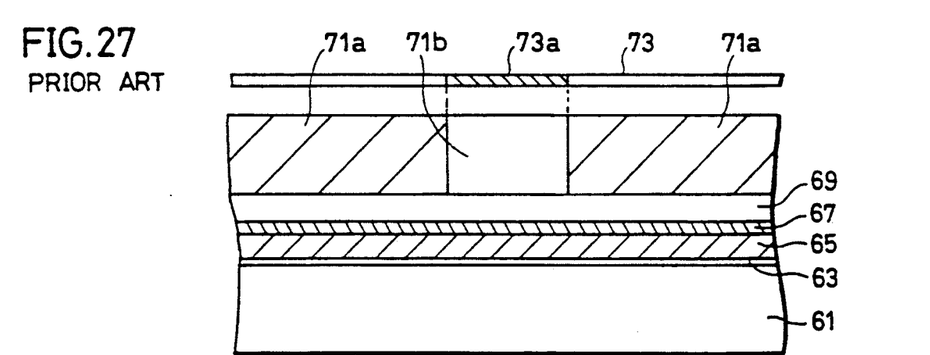

As shown in FIG. 26, i rays ($\lambda = 365$ nm) are applied through the mask 73, which has a light intercepting portion 73a allowing no transmission of the i rays. Portions of the photoresist layer 71 irradiated with the i rays are exposed. Thus, the photoresist layer 71 is separated into exposed portions 71a and an unexposed portion 71b, as shown in FIG. 27.

Figure 28:
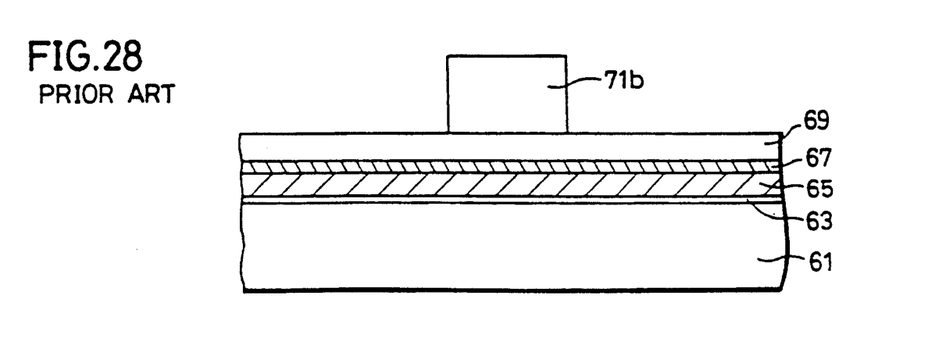
Figure 29:
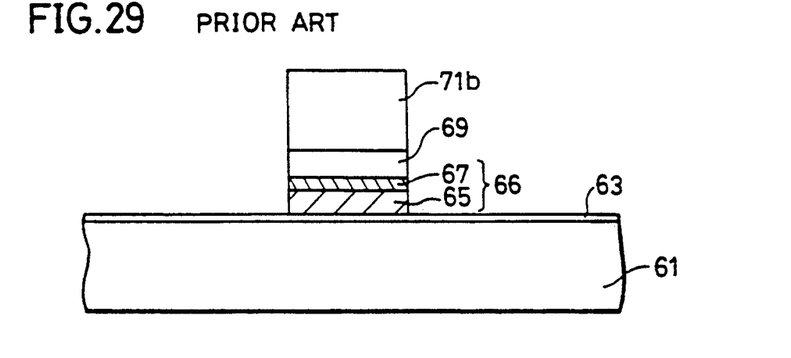

The exposed portions 71a are removed from the photoresist layer 71, as shown in FIG. 28. Then the unexposed portion 71b of the photoresist layer 71 is employed as a mask to partially remove the silicon oxide film 69, the tungsten silicide film 67 and the polycrystalline silicon film 65 successively by etching, thereby forming a gate electrode 66, as shown in FIG. 29.

Figure 30:
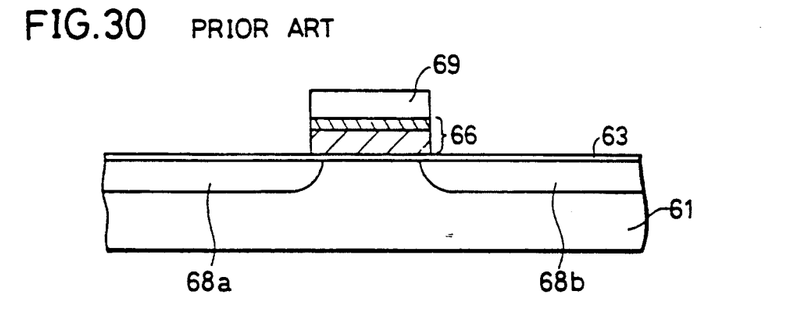
Figure 31:
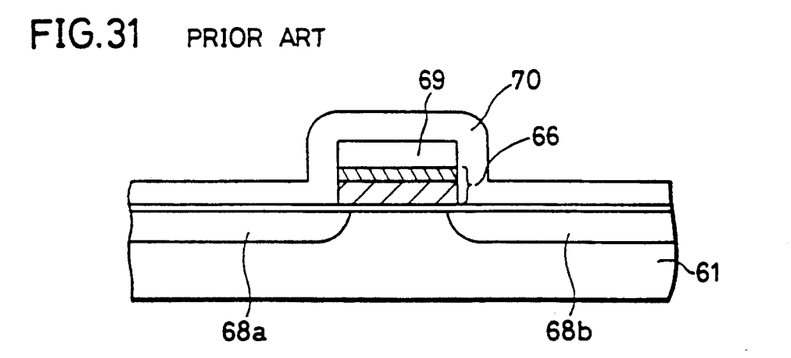

As shown in FIG. 30, the unexposed portion 71b is removed and the remaining portion of the silicon oxide film 69 is employed as a mask to implant ions into the silicon substrate 61, thereby forming source/drain regions 68a and 68b. Then a silicon oxide film 70 is formed on the silicon substrate 61, as shown in FIG. 31.

Figure 32:
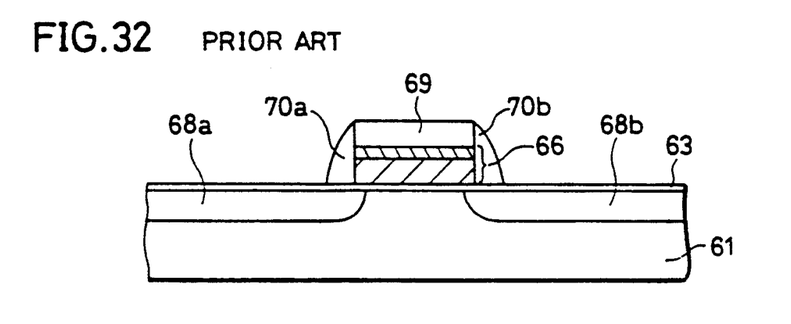

As shown in FIG. 32, the silicon oxide film 70 is etched back to form side wall insulating films 70a and 70b. The gate electrode 66 is insulated from other wires by the side wall insulating films 70a and 70b and the silicon oxide film 69. The steps of manufacturing a MOS field effect transistor are thus completed.

Figure 33:
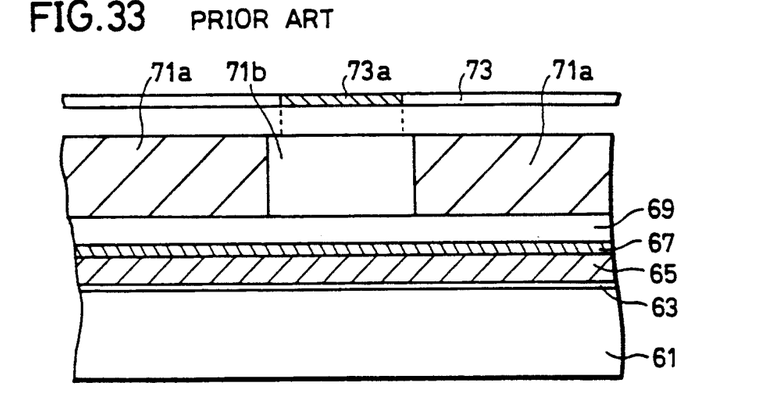
FIG. 33 is a sectional view of a silicon substrate showing a spread photoresist mask.
Figure 34:
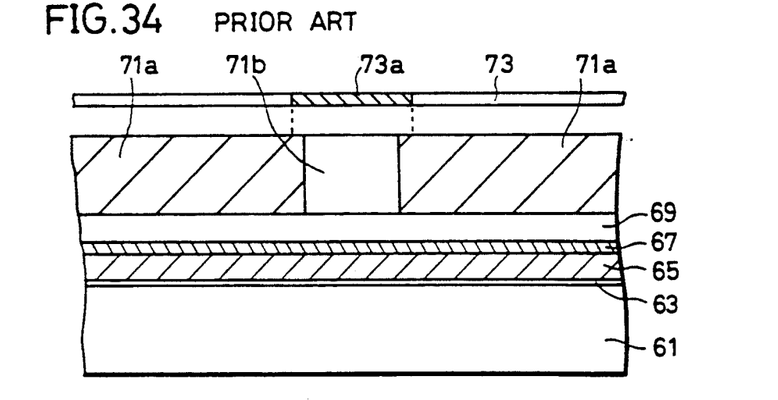
FIG. 34 is a sectional view of a silicon substrate showing a narrowed photoresist mask.

As shown in FIG. 32, the silicon oxide film 69 is so provided as to electrically insulate the gate electrode 66 from other wires. Since the silicon oxide film 69 is transparent to the i rays, the i rays are multiply reflected in the silicon oxide film 69 in exposure of the photoresist layer 71 to cause standing waves, which spread or narrow the unexposed photoresist portion 71b. Referring to FIG. 33, the unexposed photoresist portion 71b is spread in excess of desired dimensions by such standing waves caused in the silicon oxide film 69. Referring to FIG. 34, on the other hand, the unexposed photoresist portion 71b is narrowed as compared with the desired dimensions. Such spreading or narrowing of the unexposed photoresist portion 71b depends on the thickness of the silicon oxide film 69. In more concrete terms, the unexposed photoresist portion 71b is spread when the silicon oxide film 69 has a certain thickness value, while the former is narrowed when the latter has another thickness value. When such a photoresist portion is employed as a mask to form a gate electrode, it is impossible to attain desired dimensions of the gate electrode and hence desired characteristics cannot be attained in the as-obtained MOS field effect transistor.

Figure 35:
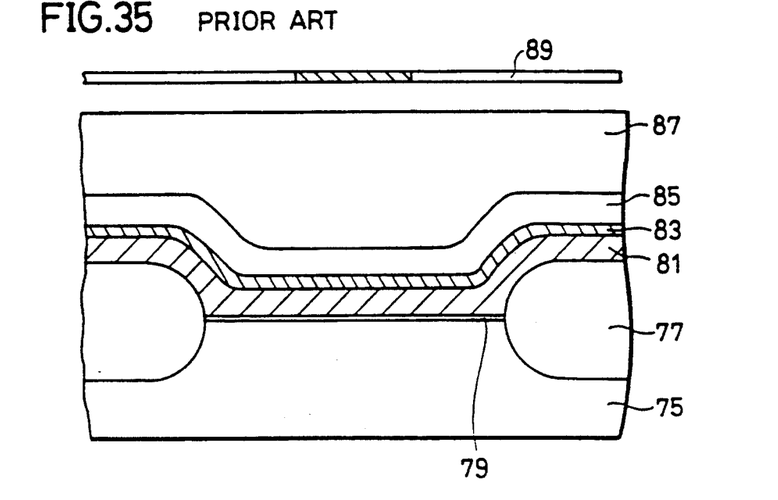
FIGS. 35 to 37 are sectional views of a silicon substrate showing first to third steps in another conventional method of manufacturing a field effect transistor.

If portions around such a photoresist layer is stepped, further, a portion of this photoresist layer to be left as a mask is disadvantageously separated by irregular reflection of the i rays, in addition to the aforementioned multiple reflection. This disadvantage is now described. As shown in FIG. 35, a silicon oxide film 79, a polycrystalline silicon film 81, a tungsten silicide film 83, a silicon oxide film 85 and a photoresist layer 87 are successively formed on a silicon substrate 75 which is provided with field oxide films 77. Then, a mask 89 is arranged above the photoresist film 87.

Figure 36:
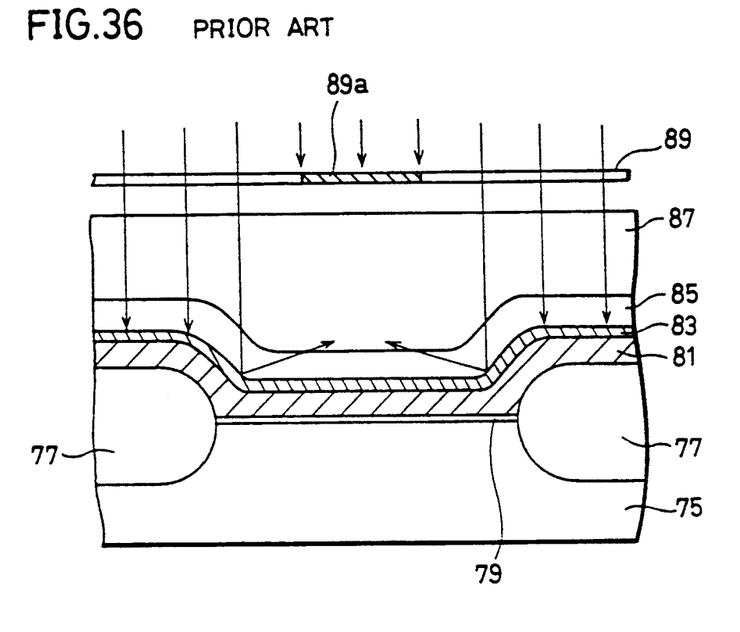
Figure 37:
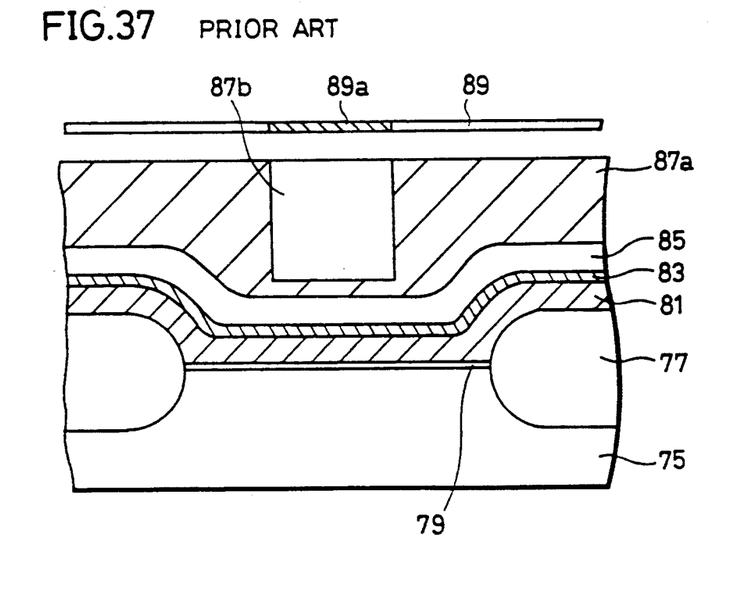

As shown in FIG. 36, i rays are applied to the photoresist layer 87 through the mask 89, to expose the photoresist layer 87. Boundaries between the field oxide films 77 and the silicon oxide film 79 are stepped. Therefore, those of the i rays which are applied to such stepped portions are transmitted through the photoresist layer 87 and the silicon oxide film 85 and irregularly reflected by the tungsten silicide film 83, which is an opaque film. Parts of the irregularly reflected i rays again pass through the silicon oxide film 85, to expose a lower portion of the photoresist layer 87 which is located under a light intercepting portion 89a. FIG. 37 illustrates this state. Referring to FIG. 37, an exposed portion 87a of the photoresist layer 87 is provided also under an unexposed portion 87b. When the exposed portion 87a of the photoresist layer 87 is removed, therefore, the unexposed portion 87b is also removed and hence no gate electrode can be formed through a photoresist mask.

Japanese Patent Laying-Open No. 4-206817 (1992) discloses a technique which can prevent a photoresist portion from spreading, narrowing and separation. This technique is now described with reference to FIGS. 38 to 41.

Figure 38:
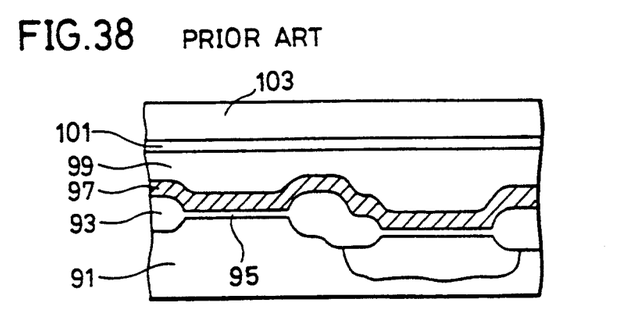
FIGS. 38 to 41 are sectional views of a silicon substrate showing first to fourth steps in a method of manufacturing a field effect transistor disclosed in Japanese Patent Laying-Open No. 4-206817.

As shown in FIG. 38, a gate oxide film 95, a polycrystalline silicon film 97, a liquid oxide film 99, a tungsten silicide film 101 and a photoresist layer 103 are successively formed on a substrate 91. Numeral 93 denotes field oxide films.

Figure 39:
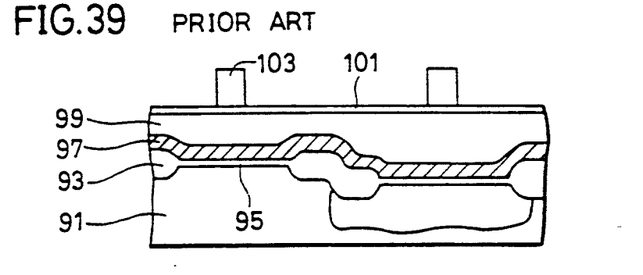

As shown in FIG. 39, the photoresist layer 103 is selectively exposed and developed. The tungsten silicide film 101, which is opaque, transmits no exposure light to the liquid oxide film 99. Thus, remaining portions of the photoresist layer 103 are neither spread nor narrowed by multiple reflection caused in the liquid oxide film 99. Further, the remaining portions of the photoresist layer 103 can be prevented from separation.

Figure 40:
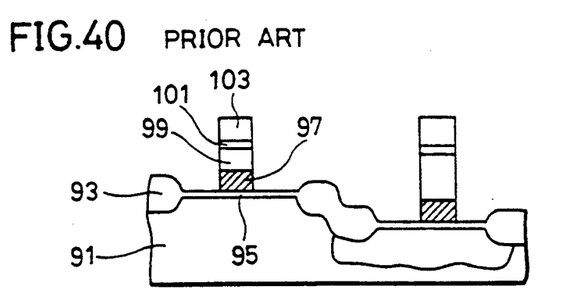

As shown in FIG. 40, the remaining portions of the photoresist layer 103 are employed as masks to selectively etch the layer formed by the tungsten silicide film 101, the liquid oxide film 99 and the polycrystalline silicon film 97.

Figure 41:
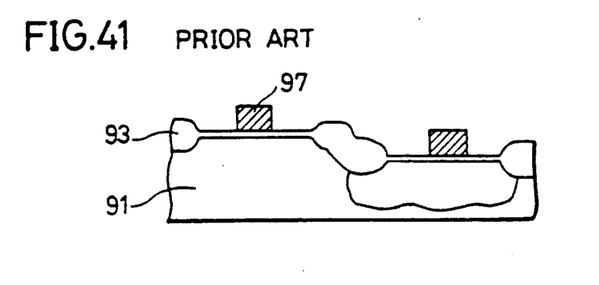

As shown in FIG. 41, the remaining portions of the photoresist layer 103, the tungsten silicide film 101 and the liquid oxide film 99 are successively removed.

In order to reduce stepped portions, it is necessary to remove the tungsten silicide film 101. The stepped portions are reduced for the following reason: A semiconductor device has a multilayer structure. If films forming the semiconductor device are stepped, this may lead to disconnection of an interconnection film which is formed on the stepped portions, for example. In the technique disclosed in Japanese Patent Laying Open No. 4-206817, the tungsten silicide film 101 is removed after formation of a gate electrode, and hence the manufacturing steps are complicated.

SUMMARY OF THE INVENTION

The present invention has been proposed in order to solve such a problem of the prior art. An object of the present invention is to provide a method which can reduce steps for forming a field effect transistor with an opaque film.

According to a first aspect of the present invention, a method of manufacturing a field effect transistor comprises a step of forming a first insulating film for serving as a gate insulating film on a major surface of a semiconductor substrate, a step of forming a conductive film for defining a gate electrode on the first insulating film, a step of forming a transparent second insulating film including at least either a silicon oxide film or a silicon nitride film on the conductive film, a step of forming an opaque film including at least one film selected from a group of a polycrystalline silicon film, an amorphous silicon film, a tungsten silicide film and a titanium nitride film, a step of forming a photoresist layer on the opaque film, a step of applying light to the photoresist layer for exposing the same in a pattern for forming the gate electrode, a step of selectively removing the opaque film through the photoresist layer serving as a mask, a step of removing the photoresist layer, a step of selectively removing the second insulating film through the opaque film serving as a mask, and a step of selectively removing the conductive film by etching through the second insulating film serving as a mask for forming the gate electrode and simultaneously removing the opaque film, employed as a mask, by the etching.

According to a second aspect of the present invention, a method of manufacturing a field effect transistor comprises a step of forming a first insulating film for serving as a gate insulating film on a major surface of a semiconductor substrate, a step of forming a conductive film for defining a gate electrode on the first insulating film, a step of forming a transparent second insulating film including at least either a silicon oxide film or a silicon nitride film on the conductive film, a step of forming an opaque film including at least one film selected from a group of a polycrystalline silicon film, an amorphous silicon film, a tungsten silicide film and a titanium nitride film, a step of forming a photoresist layer on the opaque film, a step of applying light to the photoresist layer for exposing the same in a pattern for forming the gate electrode, a step of selectively removing the opaque film and the second insulating film through the photoresist layer serving as a mask, a step of removing the photoresist layer, and a step of selectively removing the conductive film through the second insulating film serving as a mask for forming the gate electrode and simultaneously removing the opaque film by the etching.

According to the first and second aspects of the present invention, the second insulating film is employed as a mask to selectively remove the conductive film by etching for forming the gate electrode while the opaque film being employed as a mask is also removed by the etching, whereby the number of steps of manufacturing a field effect transistor can be reduced. The formation of the gate electrode and the removal of the opaque film, which have been carried out in different steps in the prior art, are carried out in the same step according to the present invention.

According to the first and second aspects of the present invention, the opaque film is formed on the transparent second insulating film, and the photoresist layer is formed on the opaque film. When the photoresist layer is patterned for formation of the gate electrode, therefore, no exposure light reaches the transparent second insulating film. Thus, a portion of the photoresist layer to remain unexposed is neither spread nor narrowed by standing waves which are caused by multiple reflection of the exposure light in the transparent second insulating film.

While the exposure light is irregularly reflected by stepped portions such as end portions of field oxide films, no such irregularly reflected light exposes the portion of the photoresist layer to remain unexposed from below since the opaque film is formed under the photoresist layer according to the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
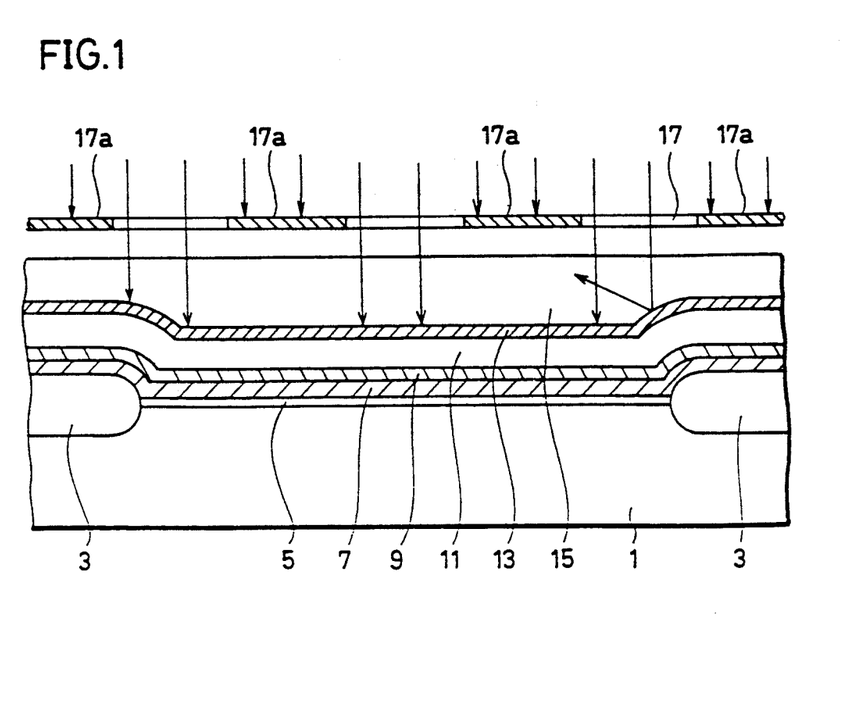
FIG. 1 is a sectional view of a silicon substrate showing an exposure step in a method of manufacturing a field effect transistor according to a first embodiment of the present invention.

FIG. 1 is a sectional view of a silicon substrate 1 showing an exposure step in a method of manufacturing a field effect transistor according to a first embodiment of the present invention. Field oxide films 3 are formed on the silicon substrate 1 with a space. A silicon oxide film 5 for serving as a gate oxide film is formed between the field oxide films 3. A polycrystalline silicon film 7, a tungsten silicide film 9, another silicon oxide film 11, another tungsten silicide film 13 and a photoresist layer 15 are successively formed on the field oxide films 3 and the silicon oxide film 5.

The polycrystalline silicon film 7 and the tungsten silicide film 9 are adapted to define gate electrodes. The tungsten silicide film 13 prevents exposure light from reaching the silicon oxide film 11, which is a transparent film. Numeral 17 denotes a mask, which has light intercepting portions 17a.

As understood from FIG. 1, the tungsten silicide film 13, which is an opaque film, is so formed on the silicon oxide film 11 that no exposure light reaches the silicon oxide film 11. Thus, unexposed portions of the photoresist layer 15 are neither spread nor narrowed by standing waves caused by multiple reflection of the light in the silicon oxide film 11.

The exposure light is irregularly reflected by stepped portions which are defined on end portions of the field oxide films 3. However, such irregularly reflected light exposes no portions of the photoresist layer 15 to remain unexposed from below since the opaque tungsten silicide film 13 is formed under the photoresist layer 15. Thus, lower parts of the portions of the photoresist layer 15 to remain unexposed are neither exposed nor removed with exposed portions.

TABLE 1

| Opaque Film | Damping Coefficient of Amount of Transmitted Light | Light Reflectance |
|---|---|---|
| Polycrystalline Silicon Film | 2.69 | about 60% |
| Tungsten Silicide Film | 2.96 | about 60% |
| Titanium Nitride Film | 1.14 | about 40% |
| Amorphous Silicon Film | 2.85 | about 40% |

Table 1 shows damping coefficients of amounts of transmitted light and light reflectance values of opaque films which are employable in the present invention. The degrees of opacity are increased with the damping coefficients. The light reflectance values are expressed by relative reflectance values (data: actually measured values) with reference to that of aluminum of 100%. When an opaque film has small light reflectance, the following effect can be attained: As shown in FIG. 1, parts of the exposure light are irregularly reflected by portions of the tungsten silicide film 13 which are located on the end portions of the field oxide films 3. Side surfaces of the portions of the photoresist layer 15 to remain unexposed are exposed by such irregularly reflected light components. If the amount of such exposure is increased, the portions to remain unexposed are disadvantageously narrowed. When the opaque film is prepared from a material having small light reflectance, however, it is possible to reduce the amounts of such narrowing in the portions of the photoresist layer 15 to remain unexposed.

Such small light reflectance of the opaque film also leads to the following effect: When the photoresist layer 15 is improved in transparency, it is possible to obtain a resist pattern of high resolution. If the transparency is too much improved, however, the photoresist layer 15 is excessively exposed by light which is reflected back from below. Thus, improvement in transparency of the photoresist layer 15 is restricted, while it is possible to improve such transparency of the photoresist layer 15 by employing an opaque film having small light reflectance.

However, the opaque film preferably has light reflectance of at least 30%. If the light reflectance of the opaque film is less than 30%, it is impossible to attain excellent exposure since the photoresist layer 15 is exposed by the light reflected back from below.

Figure 2:
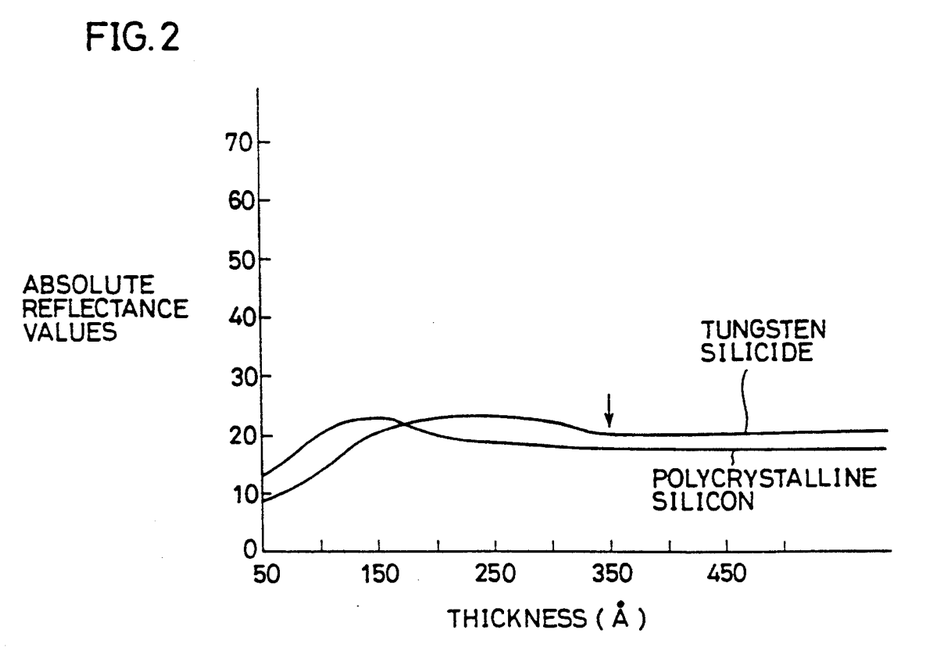
FIG. 2 is a graph showing relations between thicknesses of opaque films and absolute reflectance values.

The opaque film is preferably at least 360 Å in thickness. FIG. 2 is a graph showing relations between thicknesses of opaque films and absolute reflectance values. As understood from FIG. 2, the absolute reflectance values are stabilized when film thicknesses exceed 350 Å in both of a polycrystalline silicon film and a tungsten silicide film. This means that both of the tungsten silicide film and the polycrystalline silicon film are completely opaqued when the film thicknesses exceed 350 Å. If such an opaque film is incomplete in opacity, light passing through this film is multiply reflected in the silicon oxide film which is provided under the opaque film to cause standing waves, which stabilize the reflectance of the opaque film.

The silicon oxide film 11, which is provided under the opaque tungsten silicide film 13 in this embodiment as shown in FIG. 1, may be replaced by a silicon nitride film.

Figure 3:
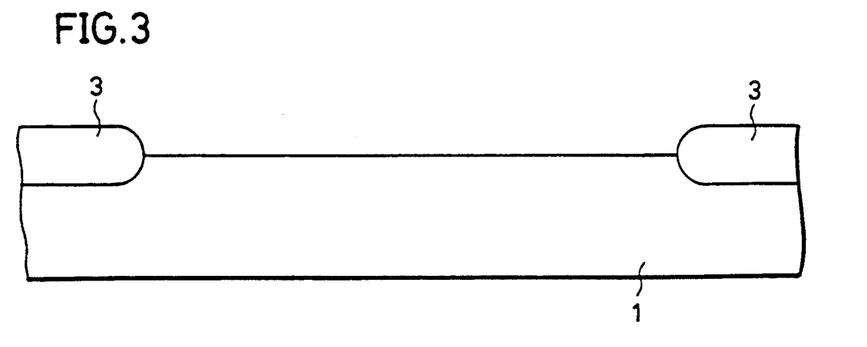
FIGS. 3 to 23 are sectional views of a silicon substrate showing first to 21st steps in the method of manufacturing a field effect transistor according to the first embodiment of the present invention.
Figure 4:
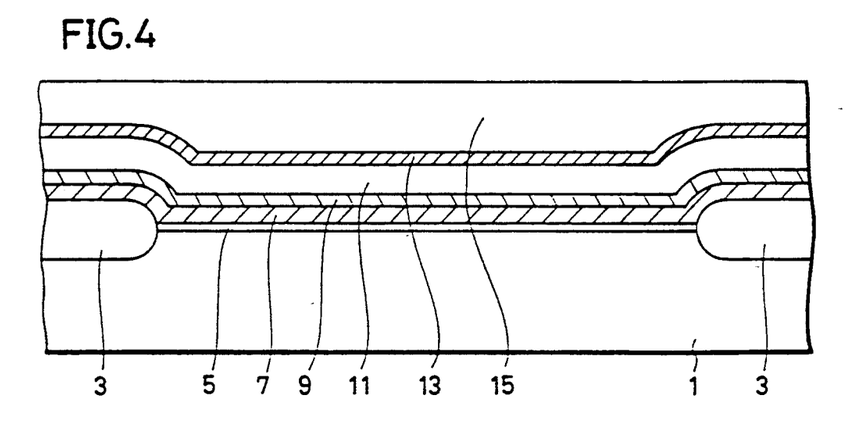

Respective steps in the method of manufacturing a field effect transistor according to the first embodiment of the present invention are now described. As shown in FIG. 3, field oxide films 3 are formed on a silicon substrate 1 by the LOCOS method. Then, a silicon oxide film 5 is formed on a portion of the silicon substrate 1 located between the field oxide films 3 by thermal oxidation. Thereafter a polycrystalline silicon film 7 is formed on the field oxide films 3 and the silicon oxide film 5 by CVD. A tungsten silicide film 9 is formed on the polycrystalline silicon film 7 by sputtering. Another silicon oxide film 11 is formed on the tungsten silicide film 9 by CVD. Another tungsten silicide film 13 is formed on the silicon oxide film 11 by sputtering. Then a photoresist layer 15 is applied onto the tungsten silicide film 13.

Figure 5:
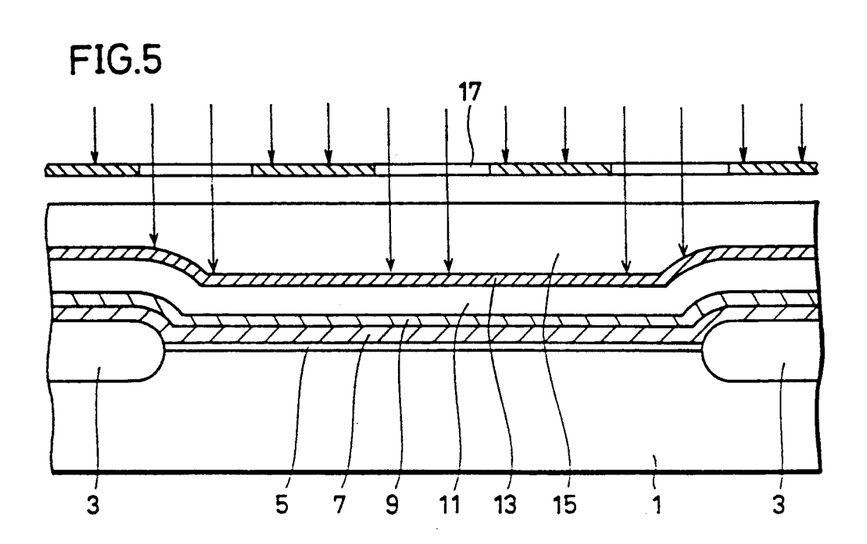
Figure 6:
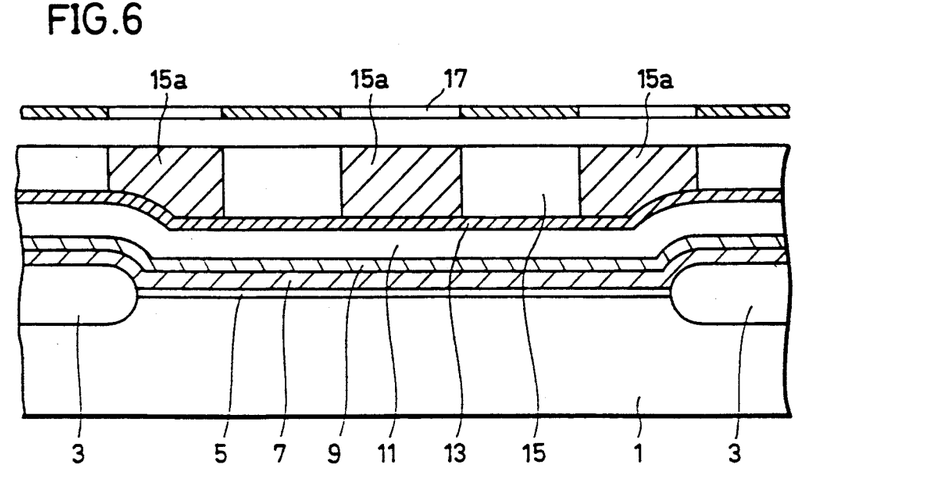

As shown in FIG. 5, a mask 17 is arranged above the photoresist layer 15, to expose the latter through the former. FIG. 6 shows the as-exposed photoresist layer 15 with exposed portions 15a.

Figure 7:
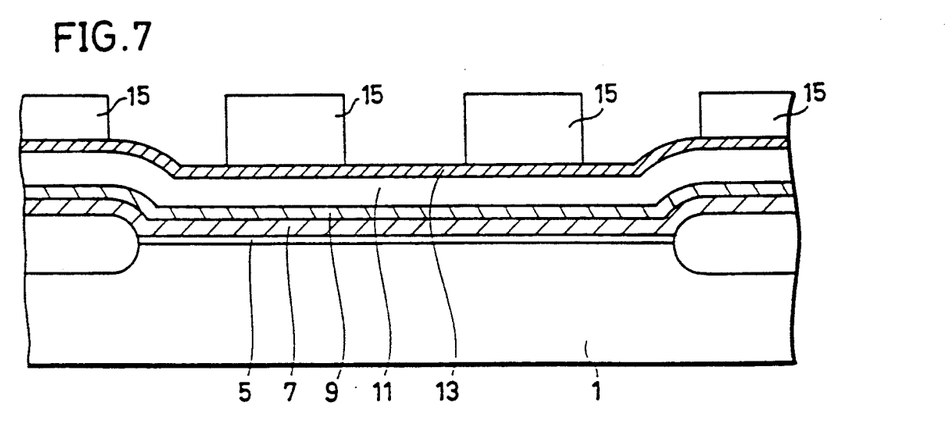
Figure 8:
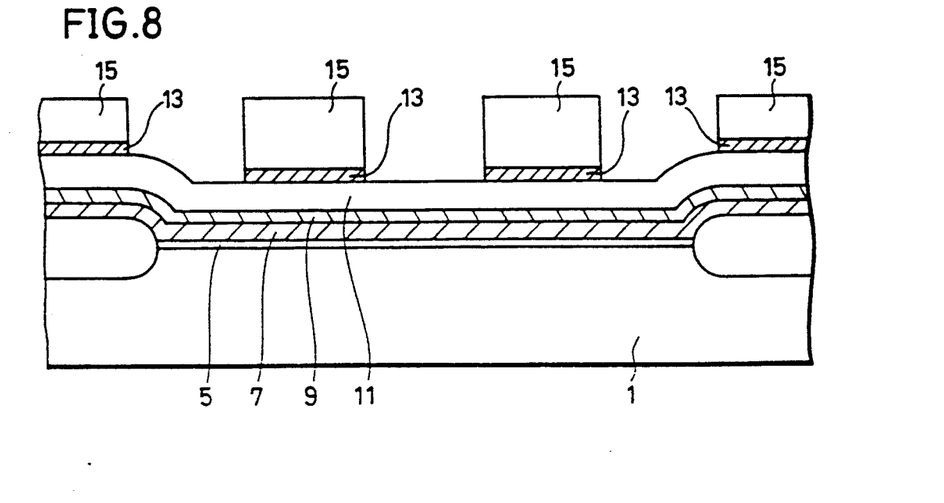

The exposed portions 15a of the photoresist layer 15 are removed as shown in FIG. 7. Then, the remaining portions of the photoresist layer 15 are employed as masks for partially removing the tungsten silicide film 13 by reactive ion etching, as shown in FIG. 8.

Figure 9:
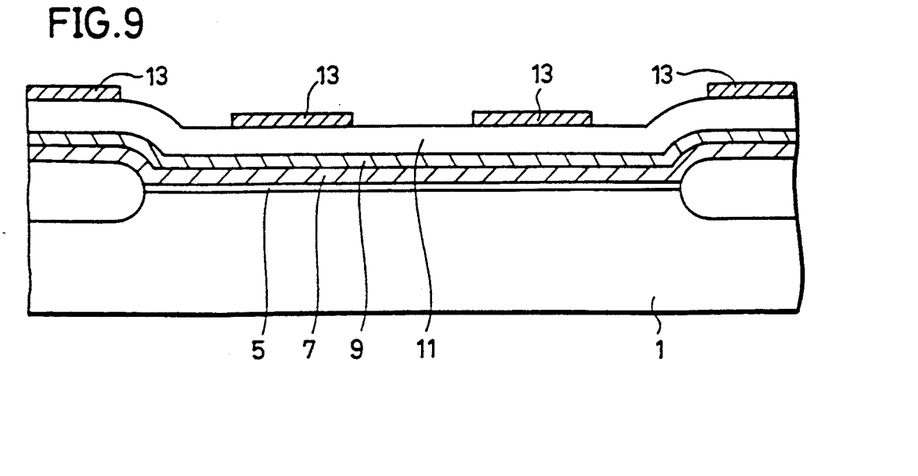
Figure 10:
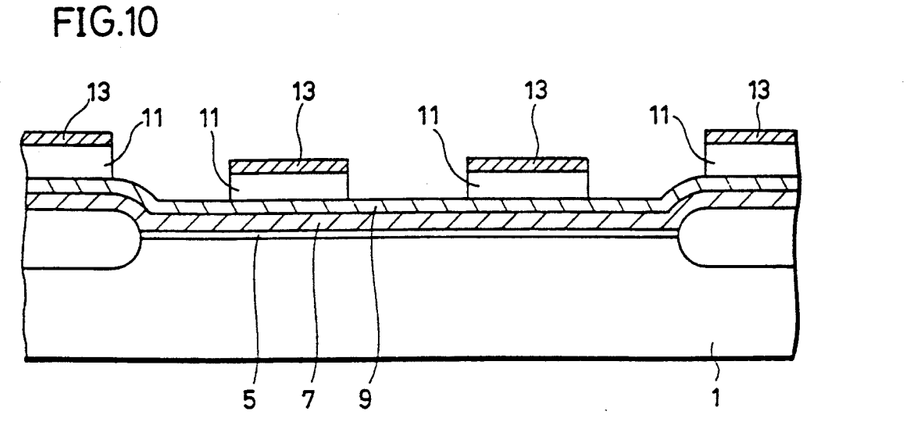

The remaining portions of the photoresist layer 15 are removed as shown in FIG. 9. Then the remaining portions of the tungsten silicide film 13 are employed as masks to partially remove the silicon oxide film 11 by reactive ion etching, as shown in FIG. 10. The remaining portions of the silicon oxide film 11 are employed as masks to partially remove the tungsten silicide film 9 and the polycrystalline silicon film 7 by reactive ion etching.

Figure 11:
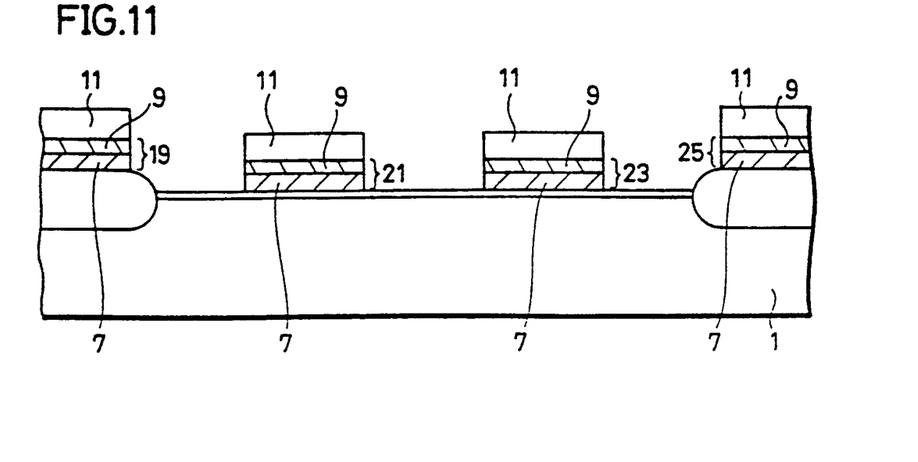
Figure 12:
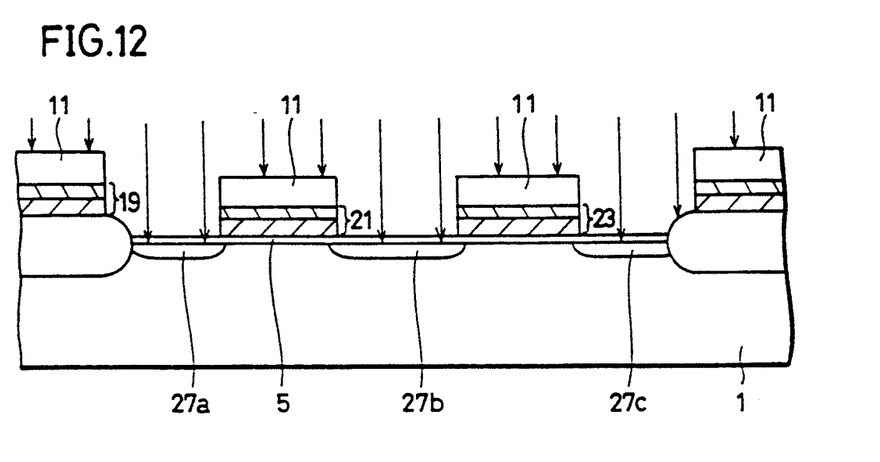

Thus, a word line 19, gate electrodes 21 and 23 and another word line 25 are formed as shown in FIG. 11. The remaining portions of the tungsten silicide film 13 located on those of the silicon oxide film 11 are also removed by this etching. Thus, no step is required for removing the remaining portions of the tungsten silicide film 13. Then the remaining portions of the silicon oxide film 11 are employed as masks to implant ions into the silicon substrate 1, thereby forming source/drain regions 27a, 27b and 27c as shown in FIG. 12.

Figure 13:
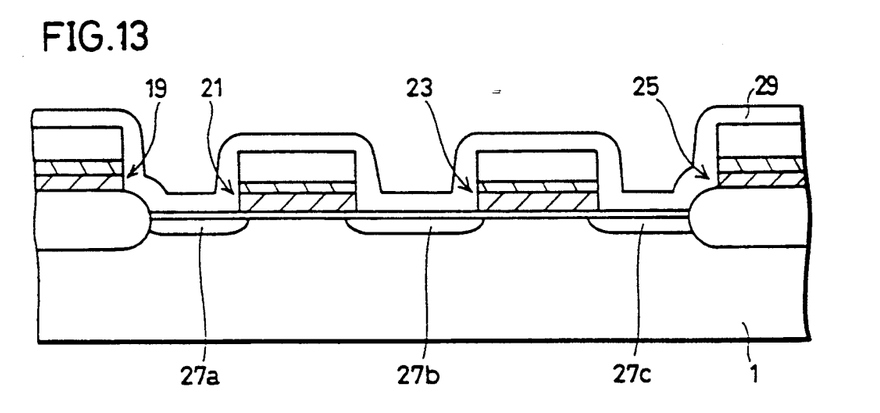
Figure 14:
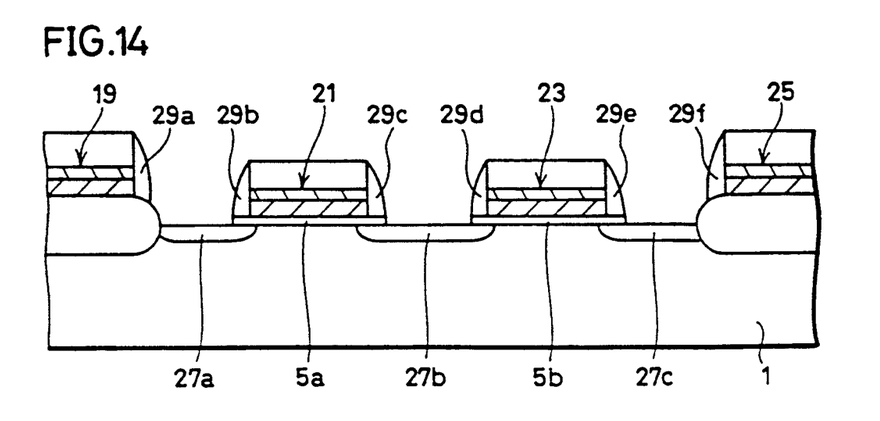

As shown in FIG. 13, a silicon oxide film 29 is formed on the overall surface of the silicon substrate 1 by CVD. Then the silicon oxide film 29 is subjected to reactive anisotropic etching, to form side wall insulating films 29a, 29b, 29c, 29d, 29e and 29f as shown in FIG. 14.

Figure 15:
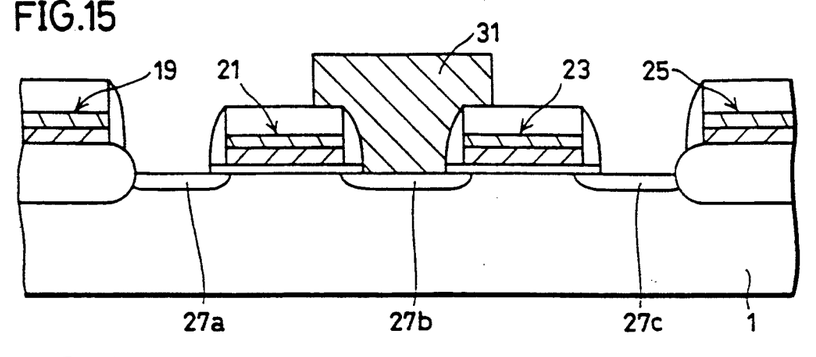
Figure 16:
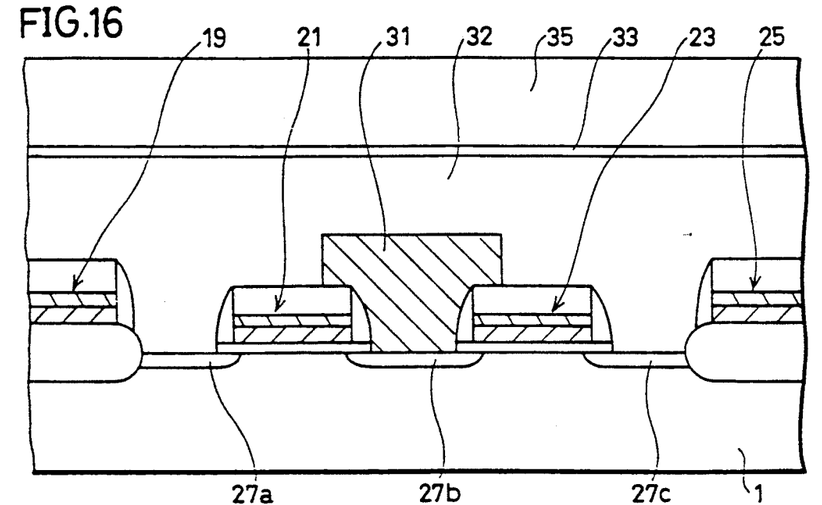

As shown in FIG. 15, a polycrystalline silicon film is formed on the overall surface of the silicon substrate 1 and patterned in a prescribed manner, to form a bit line 31 which is electrically connected with the source-/drain region 27b. As shown in FIG. 16, an interlayer insulating film 32 is formed on the overall surface of the silicon substrate 1 by CVD and a silicon nitride film 33 is formed on the interlayer isolating film 32 by CVD, while a silicon oxide film 35 is formed on the silicon nitride film 33 by CVD. The thickness of the silicon oxide film 35 defines the height of wall portions in storage nodes of capacitors in a later step. Therefore, this thickness is varied with a set value of capacitance of a DRAM as a product.

Figure 17:
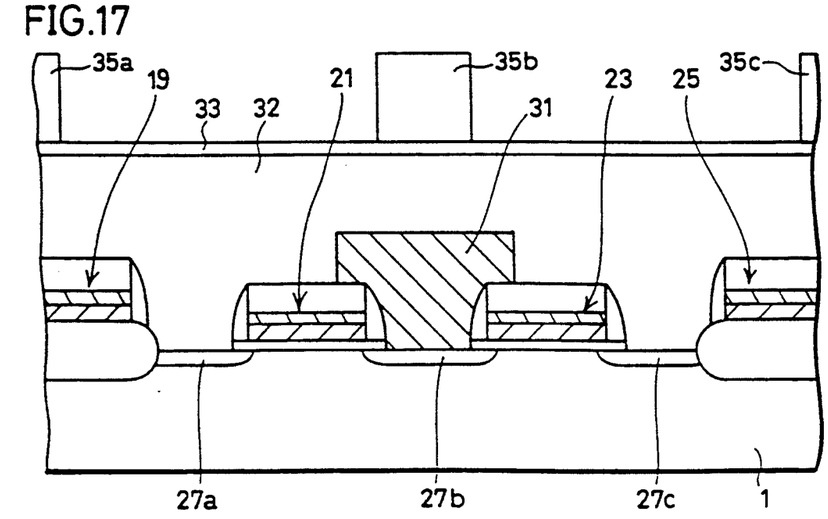

As shown in FIG. 17, the silicon oxide film 35 is patterned through a photoresist mask by etching, to define capacitor isolating layers 35a, 35b and 35c for isolating capacitors. In this etching step, the silicon nitride film 33 is different in etching rate from the silicon oxide film 35. Therefore, the etching rate is reduced when the etching proceeds to the surface of the silicon nitride film 33. The etching of the silicon oxide film 35 is stopped at this time.

Figure 18:
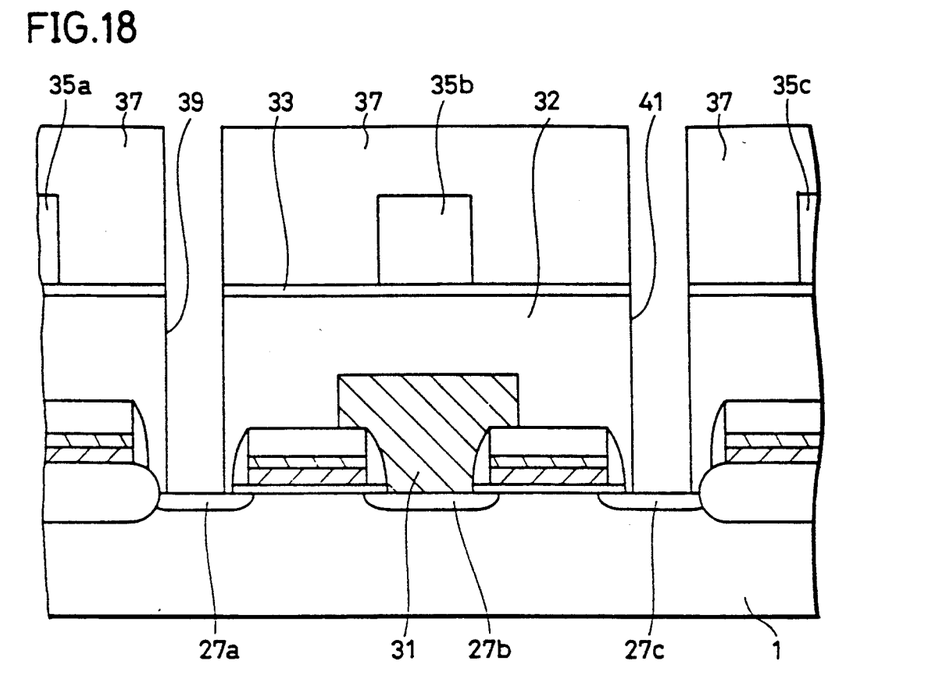

As shown in FIG. 18, photoresist layers 37 are applied and patterned in a prescribed manner. The photoresist layers 37 are employed as masks to partially remove the silicon nitride film 33 and the interlayer insulating film 32 by reactive ion etching, thereby defining through holes 39 and 41 reaching the source/drain regions 27a and 27c.

Figure 19:
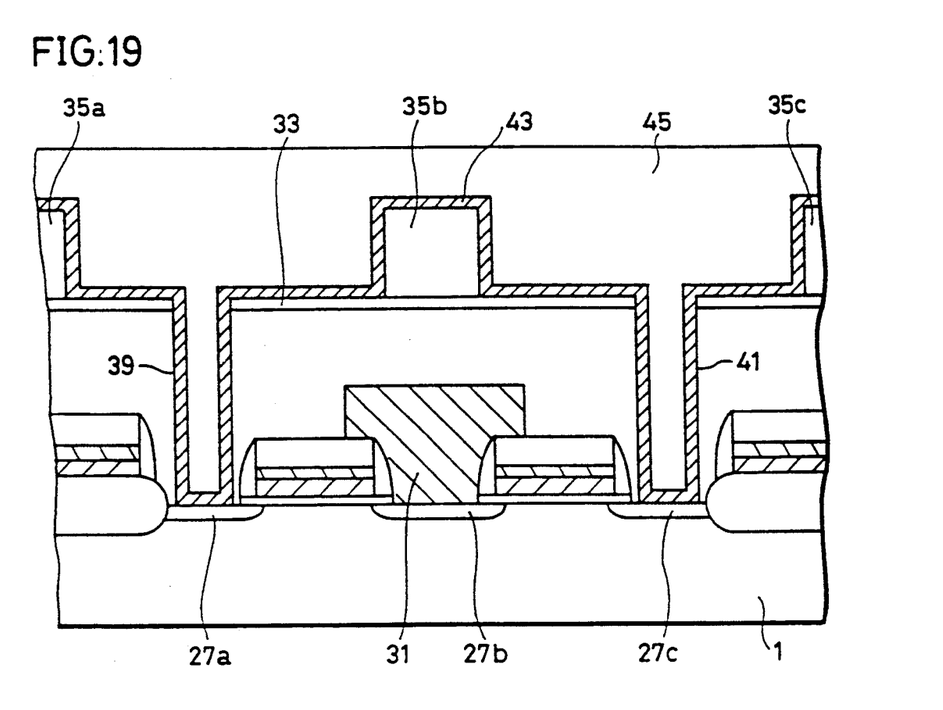
Figure 20:
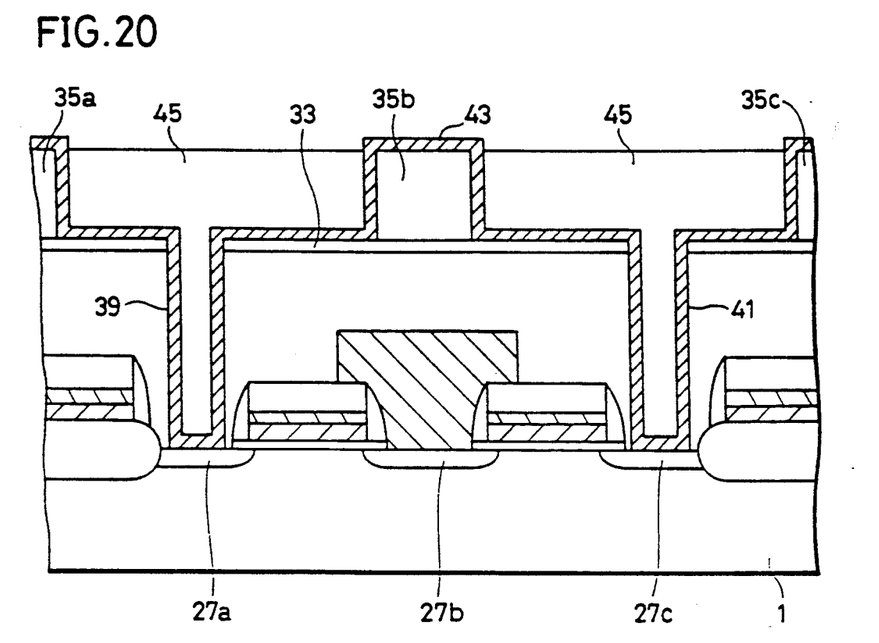

As shown in FIG. 19, the photoresist layers 37 are removed and a polycrystalline silicon film 43 is formed on the overall surface of the silicon substrate 1 by CVD. Parts of the polycrystalline silicon film 43 are electrically connected with the source/drain regions 27a and 27c. A resist layer 45 is applied onto this polycrystalline silicon film 43. As shown in FIG. 20, the resist layer 45 is etched back to partially expose the polycrystalline silicon film 43.

Figure 21:
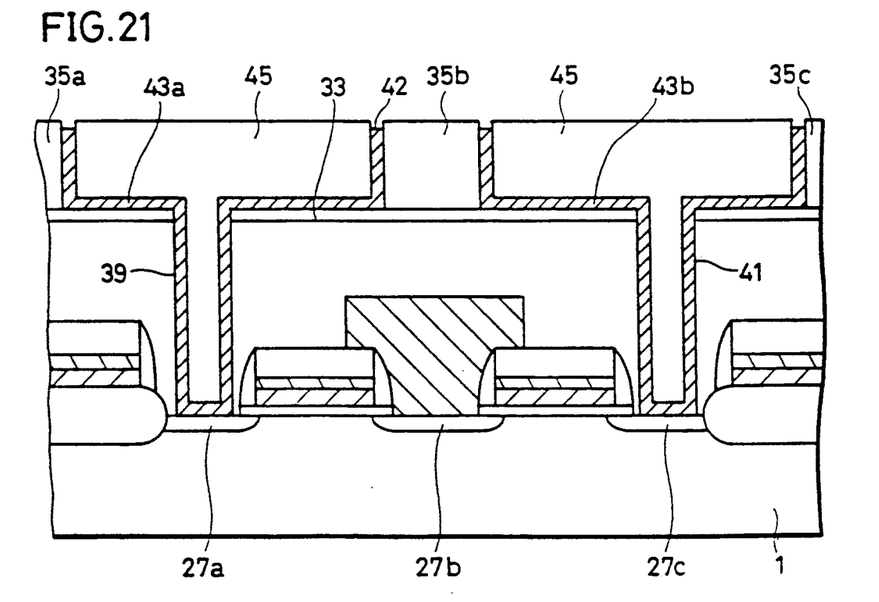
Figure 22:
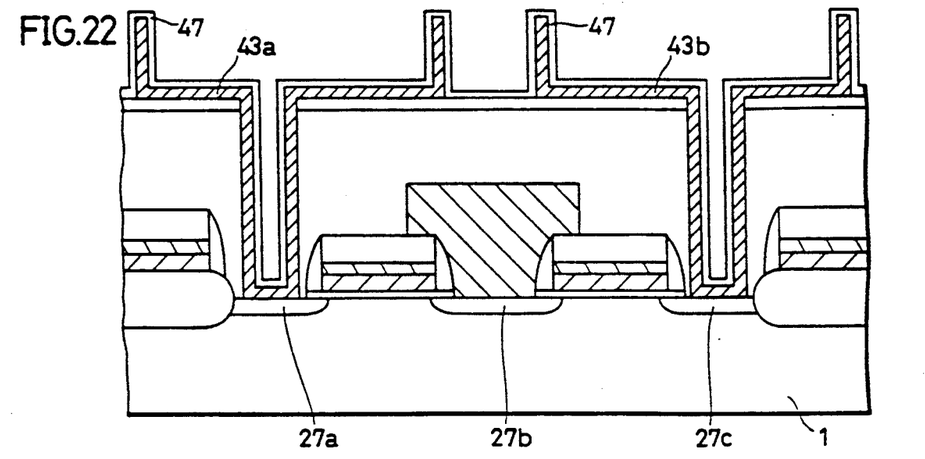

As shown in FIG. 21, the exposed portions of the polycrystalline silicon film 43 are selectively removed by reactive ion etching. Thus, the remaining portions of the polycrystalline silicon film 43 are isolated from each other on the capacitor isolating layers 35a, 35b and 35c, to define storage nodes 43a and 43b of the respective capacitors with wall portions 42. As shown in FIG. 22, the remaining portions of the resist layer 45 are removed and then the capacitor isolating layers 35a, 35b and 35c are removed by hydrofluoric acid or the like. Then, a dielectric film 47 such as a silicon nitride film, for example, is formed on the surfaces of the storage nodes 43a and 43b.

Figure 23:
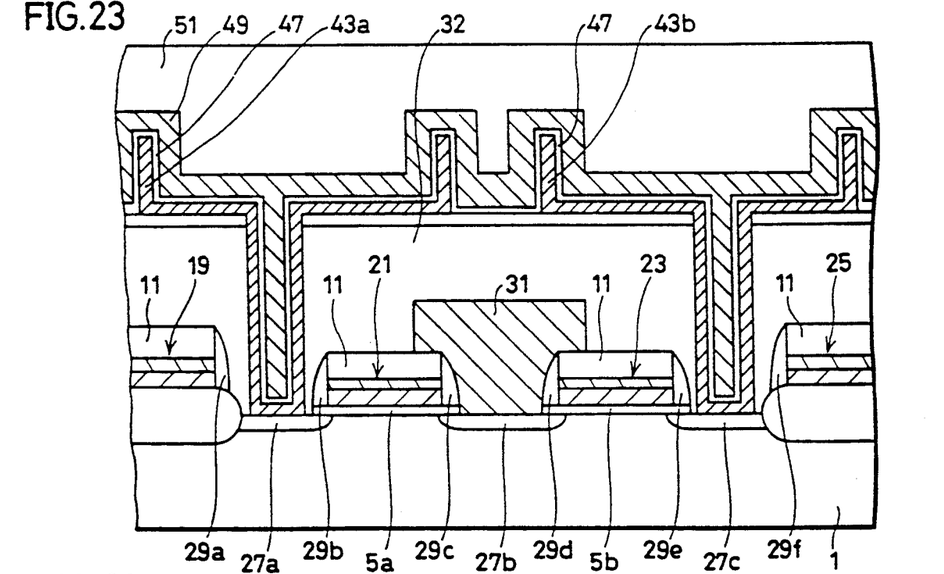

As shown in FIG. 23, a cell plate 49 of polycrystalline silicon is formed on the dielectric film 47 by CVD. A silicon oxide film 51 is formed on the cell plate 49 by CVD. Thus completed are the manufacturing steps according to the first embodiment of the present invention.

Figure 24:
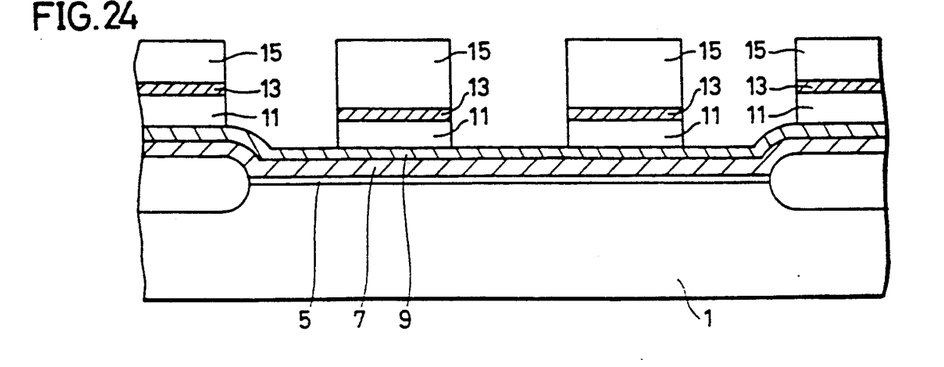
FIG. 24 is a sectional view of a silicon substrate showing a step of forming gate electrodes and word lines in a method of manufacturing a field effect transistor according to a second embodiment of the present invention.

According to the first embodiment, the tungsten silicide film 13 is partially removed through the remaining portions of the photoresist layer 15 serving as masks and the silicon oxide film 11 is partially removed through the remaining portions of the tungsten silicide film 13 serving as masks, as shown in FIGS. 8 to 10. According to a second embodiment of the present invention, however, a tungsten silicide film 13 and a silicon oxide film 11 may be partially removed through remaining portions of a photoresist layer 15 serving as masks so that the remaining portions of the photoresist layer 15 are thereafter removed, as shown in FIG. 24.

According to the inventive method of manufacturing a field effect transistor, an opaque film is formed between a transparent second insulating film and a photoresist layer so that no exposure light reaches the transparent second insulating film when the photoresist layer is patterned for defining a gate electrode. Therefore, an unexposed portion of the photoresist layer is neither spread nor narrowed by standing waves caused by multiple reflection of the light in the transparent second insulating film. In other words, the photoresist layer can be patterned in desired dimensions so that a gate electrode having desired dimensions can be formed through the photoresist layer, whereby desired characteristics can be attained in the as-formed field effect transistor.

While the exposure light is irregularly reflected by stepped portions such as end portions of field oxide films, no such irregularly reflected light exposes a portion of the photoresist layer to remain unexposed from below since an opaque film is provided under the photoresist layer according to the inventive method of manufacturing a field effect transistor. Thus, the portion of the photoresist layer to be left as a mask remains unremoved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a field effect transistor, comprising:
    a step of forming a first insulating film for serving as a gate insulating film on a major surface of a semiconductor substrate;
    a step of forming a gate electrode on said first insulating film;
    a step of forming a transparent second insulating film including at least either a silicon oxide film or a silicon nitride film on said conductive film;
    a step of forming an opaque film including at least one film selected from a group of a polycrystalline silicon film, an amorphous silicon film, a tungsten silicide film and a titanium nitride film on said second insulating film;
    a step of forming a photoresist layer on said opaque film;
    a step of applying light to said photoresist layer for exposing said photoresist layer in a pattern for forming said gate electrode;
    a step of selectively removing said opaque film through said photoresist layer serving as a mask;
    a step of removing said photoresist layer;
    a step of selectively removing said second insulating film through said opaque film serving as a mask; and
    a step of selectively removing said conductive film by etching through said second insulating film serving as a mask for forming said gate electrode and simultaneously removing said opaque film being employed as said mask by said etching.

2. A method of manufacturing a field effect transistor in accordance with claim 1, wherein said conductive film has etchability being equivalent to that of said opaque film.

3. A method of manufacturing a field effect transistor in accordance with claim 1, wherein
said opaque film and said conductive film are made of the same material.

4. A method of manufacturing a field effect transistor in accordance with claim 1, wherein
said opaque film has a thickness of at least 350 Å.

5. A method of manufacturing a field effect transistor in accordance with claim 1, wherein
reflectance of said opaque film to light is at least 30% and not more than 60%.

6. A method of manufacturing a field effect transistor, comprising:
a step of forming a first insulating film for serving as a gate insulating film on a major surface of a semiconductor substrate;
a step of forming a conductive film for defining a gate electrode on said first insulating film;
a step of forming a transparent second insulating film including at least either a silicon oxide film or a silicon nitride film on said conductive film;
a step of forming an opaque film including at least one film selected from a group of a polycrystalline silicon film, an amorphous silicon film, a tungsten silicide film and a titanium nitride film on said second insulating film;
a step of forming a photoresist layer on said opaque film;
a step of applying light to said photoresist layer for exposing said photoresist layer in a pattern for forming said gate electrode;
a step of selectively removing said opaque film and said second insulating film through said photoresist layer serving as a mask;
a step of removing said photoresist layer; and
a step of selectively removing said conductive film by etching through said second insulating film serving as a mask for forming said gate electrode and simultaneously removing said opaque film by said etching.

7. A method of manufacturing a field effect transistor in accordance with claim 6, wherein
said conductive film has etchability being equivalent to that of said opaque film.

8. A method of manufacturing a field effect transistor in accordance with claim 6, wherein
said opaque film and said conductive film are made of the same material.

9. A method of manufacturing a field effect transistor in accordance with claim 6, wherein
said opaque film has a thickness of at least 350 Å.

10. A method of manufacturing a field effect transistor in accordance with claim 6, wherein
reflectance of said opaque film to light is at least 30% and not more than 60%.

* * * * *